United States Patent
Takenaka (10) Patent No.: US 10,992,267 B2
(45) Date of Patent: Apr. 27, 2021

(54) POWER AMPLIFIER MODULE, FRONTEND CIRCUIT, AND COMMUNICATION DEVICE

(71) Applicant: Murata Manufacturing Co., Ltd., Kyoto (JP)

(72) Inventor: Isao Takenaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/778,854

(22) Filed: Jan. 31, 2020

(65) Prior Publication Data

US 2020/0169225 A1    May 28, 2020

Related U.S. Application Data

(63) Continuation of application No. 16/255,006, filed on Jan. 23, 2019, now Pat. No. 10,554,180, which is a
(Continued)

(30) Foreign Application Priority Data

Aug. 10, 2016  (JP) .............................. JP2016-158068

(51) Int. Cl.
*H03F 1/26*  (2006.01)
*H04B 1/16*  (2006.01)
(Continued)

(52) U.S. Cl.
CPC ........... *H03F 1/26* (2013.01); *H01L 23/5383* (2013.01); *H01L 23/5386* (2013.01);
(Continued)

(58) Field of Classification Search
CPC ...... H03F 1/26; H03F 3/211; H03F 2200/102; H03F 2200/129; H03F 2200/144165;
(Continued)

(56) References Cited

U.S. PATENT DOCUMENTS 10,554,180 B2 *  2/2020  Takenaka .............. H01L 23/50
2013/0207732 A1  8/2013  Cabanillas et al.
2013/0260704 A1  10/2013  Yu et al.

FOREIGN PATENT DOCUMENTS

JP    S62-39908       2/1987
JP    H04-261205 A    9/1992
(Continued)

OTHER PUBLICATIONS

International Search Report for International Application No. PCT/JP2017/028276 dated Oct. 24, 2017.
(Continued)

*Primary Examiner* — Lee Nguyen
(74) *Attorney, Agent, or Firm* — Pearne & Gordon LLP (57) ABSTRACT

A PA module includes: a multilayer substrate having a ground pattern layer connected to a ground of a power source; amplifier transistors disposed on the multilayer substrate; a bypass capacitor having one end connected to the collector of the amplifier transistor; a first wiring line connecting the emitter of the amplifier transistor and the ground pattern layer to each other; a second wiring line connecting the emitter of the amplifier transistor and the ground pattern layer to each other; a third wiring line connecting the other end of the bypass capacitor and the ground pattern layer to each other; and a fourth wiring line formed between the amplifier transistor and the ground pattern layer and between the bypass capacitor and the ground pattern layer and connecting the first wiring line and the third wiring line to each other.

14 Claims, 8 Drawing Sheets

Related U.S. Application Data continuation of application No. PCT/JP2017/028276, filed on Aug. 3, 2017.

(51) Int. Cl.
| | |
|---|---|
| *H03F 3/195* | (2006.01) |
| *H04B 1/525* | (2015.01) |
| *H04B 1/04* | (2006.01) |
| *H03F 3/24* | (2006.01) |
| *H01L 23/538* | (2006.01) |
| *H01L 25/16* | (2006.01) |
| *H03F 3/21* | (2006.01) |
| *H04B 1/10* | (2006.01) |

(52) U.S. Cl.
CPC ............. *H01L 25/16* (2013.01); *H03F 3/195* (2013.01); *H03F 3/211* (2013.01); *H03F 3/245* (2013.01); *H04B 1/0458* (2013.01); *H04B 1/0475* (2013.01); *H04B 1/1018* (2013.01); *H04B 1/1607* (2013.01); *H04B 1/525* (2013.01); *H03F 2200/102* (2013.01); *H03F 2200/129* (2013.01); *H03F 2200/144* (2013.01); *H03F 2200/165* (2013.01); *H03F 2200/171* (2013.01); *H03F 2200/294* (2013.01); *H03F 2200/451* (2013.01); *H04B 2001/0408* (2013.01)

(58) Field of Classification Search
CPC ......... H03F 2200/171; H03F 2200/294; H03F 2200/451; H01L 23/5358; H01L 23/5386; H01L 25/16; H04B 1/1018; H04B 1/1607
USPC ....................... 330/133, 310–311; 455/127.3
See application file for complete search history.

(56) References Cited

FOREIGN PATENT DOCUMENTS

| | | |
|---|---|---|
| JP | H11-331013 | 11/1999 |
| JP | H11-340630 | 12/1999 |
| JP | 2001-284992 A | 10/2001 |
| JP | 2006-108303 A | 4/2006 |
| JP | 2006-310463 | 11/2006 |
| JP | 2001-320170 A | 11/2011 |

OTHER PUBLICATIONS

Opinion for International Application No. PCT/JP2017/028276 dated Oct. 24, 2017.

* cited by examiner

PRIOR ART

POWER AMPLIFIER MODULE, FRONTEND CIRCUIT, AND COMMUNICATION DEVICE

This is a continuation of U.S. patent application Ser. No. 16/255,006 filed on Jan. 23, 2019, which is a continuation of International Application No. PCT/JP2017/028276 filed on Aug. 3, 2017 which claims priority from Japanese Patent Application No. 2016-158068 filed on Aug. 10, 2016. The contents of these applications are incorporated herein by reference in their entireties.

BACKGROUND OF THE DISCLOSURE

Field of the Disclosure

The present disclosure relates to a power amplifier module, a frontend circuit, and a communication device.

Description of the Related Art

Frontend circuits for recent mobile phones are required to allow transmission/reception signals to propagate with low loss in order to be ready for multiband. Therefore, a power amplifier circuit that amplifies transmission signals is required to transmit transmission signals with low noise while maintaining the gain at the time of transmission.

Figure 9:
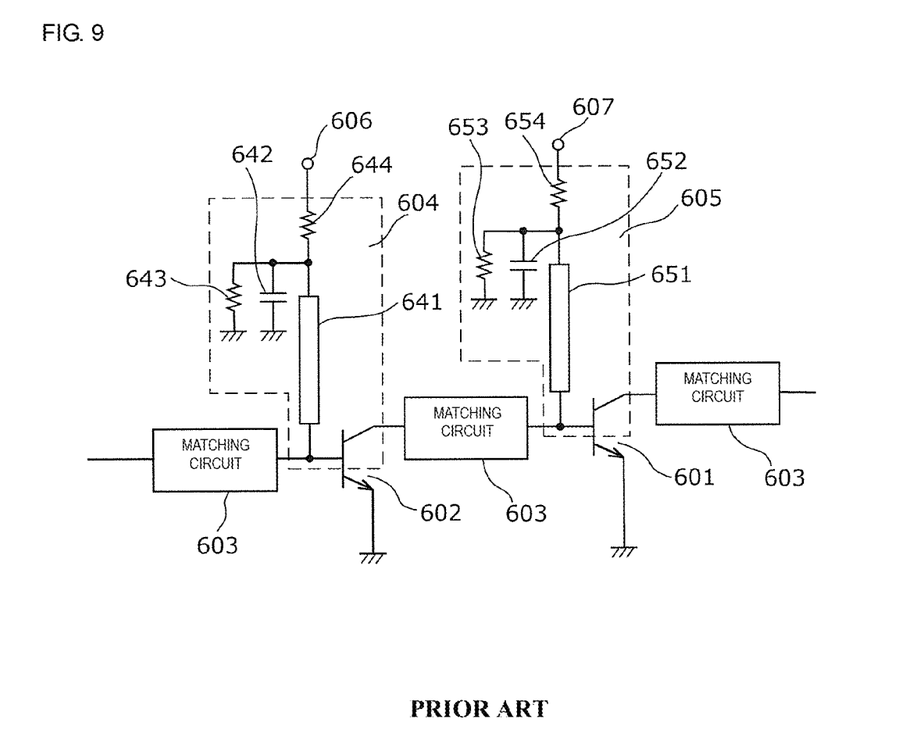
FIG. 9 is an equivalent circuit diagram of a radio-frequency multistage AB-class bias amplifier described in Patent Document 1.

FIG. 9 is an equivalent circuit diagram of a radio-frequency multistage AB-class bias amplifier described in Patent Document 1. The radio-frequency multistage AB-class bias amplifier illustrated in FIG. 9 is constituted by a subsequent radio-frequency transistor 601, a succeeding radio-frequency transistor 602, matching circuits 603, bias circuits 604 and 605, and bias power terminals 606 and 607. The bias circuit 604 includes a strip line 641, a radio-frequency bypass capacitor 642, a bias resistor 643, and a bias bleeder resistor 644. The bias circuit 605 includes a strip line 651, a radio-frequency bypass capacitor 652, a bias resistor 653, and a bias bleeder resistor 654. The bias circuits 604 and 605, which are used to supply power to the subsequent radio-frequency transistor 601 and to the succeeding radio-frequency transistor 602, are constituted by a choke circuit formed of the strip lines 641 and 651 and the radio-frequency bypass capacitors 642 and 652 for shorting and terminating RF signals to prevent RF signals from leaking into the bias circuits. Accordingly, power is stably supplied to the subsequent radio-frequency transistor 601 and to the succeeding radio-frequency transistor 602.

Patent Document 1: Japanese Unexamined Patent Application Publication No. 62-39908

BRIEF SUMMARY OF THE DISCLOSURE

A power amplifier module used in recent mobile phone terminals includes a power amplifier circuit, a communication band selection switch, a matching circuit component, and so on, which are mounted on a multilayer substrate in which circuit elements are embedded. In the power amplifier module that is formed on the multilayer substrate as described above, an inductance component is generated in a grounded part of a power amplifier element due to a wiring line that connects an amplifier and a ground layer formed in the multilayer substrate to each other and causes an increase in power noise, which is an issue. For example, in the equivalent circuit in FIG. 9, a very small inductance (L) is present on the path from the emitter terminal of the subsequent radio-frequency transistor 601 to the grounded part and on the path from the emitter terminal of the succeeding radio-frequency transistor 602 to the grounded part, and causes an increase in power noise (V) expressed by V=L (di/dt) due to a return current (i) that flows through the grounded part.

The present disclosure has been made in order to address the issue described above, and an object thereof is to provide a power amplifier module and a communication device in which power noise is reduced.

To achieve the object described above, a power amplifier module according to an aspect of the present disclosure is a power amplifier module constituted by power amplifier elements connected in multiple stages, including: a multilayer substrate that has a ground pattern layer connected to a ground terminal of a power source; a first power amplifier element that is disposed on the multilayer substrate and that has a first terminal, a second terminal, and a first input terminal; a second power amplifier element that is disposed on the multilayer substrate and that has a third terminal, a fourth terminal, and a second input terminal connected to the first terminal; a bias circuit that supplies a bias voltage to the first input terminal and to the second input terminal; a first bypass capacitor that has one end connected to the third terminal; a first conductive pattern that is formed between the first power amplifier element and the ground pattern layer and that connects the second terminal and the ground pattern layer to each other; a second conductive pattern that is formed between the second power amplifier element and the ground pattern layer and that connects the fourth terminal and the ground pattern layer to each other; a third conductive pattern that is formed between the first bypass capacitor and the ground pattern layer and that connects the other end of the first bypass capacitor and the ground pattern layer to each other; and a fourth conductive pattern that is formed between the first power amplifier element and the ground pattern layer and between the first bypass capacitor and the ground pattern layer and that connects the first conductive pattern and the third conductive pattern to each other.

With the above-described configuration, the first conductive pattern for grounding the first power amplifier element and the third conductive pattern for grounding the first bypass capacitor are connected to each other by the fourth conductive pattern closer to the first power amplifier element than the ground pattern layer. Accordingly, the fourth conductive pattern is connected in parallel to the first conductive pattern, and therefore, an inductance component generated between the second terminal of the first power amplifier element and the ground pattern layer can be made smaller than the inductance component of the first conductive pattern. As a result, it is possible to reduce power noise in the power amplifier module.

Furthermore, the fourth conductive pattern may be constituted by a plurality of conductive wiring lines that are formed in a same layer between the first power amplifier element and the ground pattern layer and between the first bypass capacitor and the ground pattern layer.

Accordingly, the inductance component of the fourth conductive pattern can be made smaller than that in a case where the fourth conductive pattern is constituted by one conductive wiring line. When the fourth conductive pattern having a smaller inductance component is connected in parallel to the first conductive pattern, it is possible to further reduce the inductance component generated between the second terminal of the first power amplifier element and the ground pattern layer.

Furthermore, the power amplifier module described above may further include a fifth conductive pattern that is formed between the second power amplifier element and the ground pattern layer and between the first bypass capacitor and the ground pattern layer and that connects the second conductive pattern and the third conductive pattern to each other.

Accordingly, the second conductive pattern for grounding the second power amplifier element and the third conductive pattern for grounding the first bypass capacitor are connected to each other by the fifth conductive pattern closer to the second power amplifier element than the ground pattern layer. As a result, the fifth conductive pattern is connected in parallel to the second conductive pattern, and therefore, an inductance component generated between the fourth terminal of the second power amplifier element and the ground pattern layer can be made smaller than the inductance component of the second conductive pattern. As a result, it is possible to reduce power noise in the power amplifier module.

Furthermore, the power amplifier module described above may further include: a third power amplifier element that is disposed on the multilayer substrate closer to the power source than the first power amplifier element and the second power amplifier element and that has a fifth terminal, a sixth terminal, and a third input terminal connected to the third terminal; a second bypass capacitor that has one end connected to the fifth terminal; a sixth conductive pattern that is formed between the third power amplifier element and the ground pattern layer and that connects the sixth terminal and the ground pattern layer to each other; a seventh conductive pattern that is formed between the second bypass capacitor and the ground pattern layer and that connects the other end of the second bypass capacitor and the ground pattern layer to each other; and an eighth conductive pattern that is formed between the third power amplifier element and the ground pattern layer and between the second bypass capacitor and the ground pattern layer and that connects the sixth conductive pattern and the seventh conductive pattern to each other.

Accordingly, the sixth conductive pattern for grounding the third power amplifier element and the seventh conductive pattern for grounding the second bypass capacitor are connected to each other by the eighth conductive pattern closer to the third power amplifier element than the ground pattern layer. As a result, the eighth conductive pattern is connected in parallel to the sixth conductive pattern, and therefore, an inductance component generated between the sixth terminal of the third power amplifier element and the ground pattern layer can be made smaller than the inductance component of the sixth conductive pattern. As a result, it is possible to reduce power noise in the power amplifier module.

Furthermore, the fifth conductive pattern and the eighth conductive pattern may be formed in different layers.

Accordingly, the fifth conductive pattern and the eighth conductive pattern can be disposed and laid out more flexibly, and therefore, the impedance of the second power amplifier element and that of the third power amplifier element can be adjusted more easily.

Furthermore, the second power amplifier element may be disposed closer to the power source than the first power amplifier element, the fourth conductive pattern and the fifth conductive pattern may be each constituted by one or more conductive wiring lines, and the number of conductive wiring lines that constitute the fourth conductive pattern may be larger than the number of conductive wiring lines that constitute the fifth conductive pattern.

The distance between the first power amplifier element and the ground terminal of the power source is longer the distance between the second power amplifier element and the ground terminal of the power source, and therefore, the first conductive pattern is longer than the second conductive pattern, and the inductance component of the first conductive pattern is larger than the inductance component of the second conductive pattern. Meanwhile, the number of conductive wiring lines constituting the fourth conductive pattern is larger than the number of conductive wiring lines constituting the fifth conductive pattern, and therefore, the inductance component of the fourth conductive pattern is smaller than the inductance component of the fifth conductive pattern. Accordingly, the inductance component generated between the second terminal of the first power amplifier element and the ground pattern layer can be further made smaller than the inductance component generated between the fourth terminal of the second power amplifier element and the ground pattern layer. As a result, it is possible to effectively reduce power noise in the first power amplifier element in which power noise is most likely to be superimposed, and it is possible to effectively reduce power noise in the power amplifier module accordingly.

Furthermore, the second power amplifier element may be disposed closer to the power source than the first power amplifier element, the fourth conductive pattern and the fifth conductive pattern may be each constituted by a conductive wiring line, and a line width of the conductive wiring line that constitutes the fourth conductive pattern may be larger than a line width of the conductive wiring line that constitutes the fifth conductive pattern.

Furthermore, the second power amplifier element may be disposed closer to the power source than the first power amplifier element, the fourth conductive pattern and the fifth conductive pattern may be each constituted by a conductive wiring line, and the conductive wiring line that constitutes the fourth conductive pattern may be shorter than the conductive wiring line that constitutes the fifth conductive pattern.

Accordingly, the inductance component of the fourth conductive pattern is smaller than the inductance component of the fifth conductive pattern, and therefore, the inductance component generated between the second terminal of the first power amplifier element and the ground pattern layer can be further made smaller than the inductance component generated between the fourth terminal of the second power amplifier element and the ground pattern layer. As a result, it is possible to effectively reduce power noise in the first power amplifier element in which power noise is most likely to be superimposed, and it is possible to effectively reduce power noise in the power amplifier module accordingly.

Furthermore, the power amplifier module described above may further include a supply modulator that modulates a power voltage outputted from the power source in accordance with an envelope tracking system and that outputs the modulated power voltage to the first terminal and to the third terminal.

Accordingly, it is possible to reduce power noise in the power amplifier module that employs an envelope tracking system.

A frontend circuit according to an aspect of the present disclosure includes: the power amplifier module described above; a transmission filter element and a reception filter element; and a separator that outputs a radio-frequency reception signal from an antenna element to the reception filter element and that outputs a radio-frequency transmission signal amplified by the power amplifier module and passing through the transmission filter element to the antenna element.

With the above-described configuration, it is possible to provide a frontend circuit in which power noise is reduced.

A communication device according to an aspect of the present disclosure includes: the frontend circuit described above; and an RF signal processing circuit that outputs a radio-frequency transmission signal to the frontend circuit and that receives a radio-frequency reception signal from the frontend circuit.

With the above-described configuration, it is possible to provide a communication device in which power noise is reduced.

According to the present disclosure, it is possible to provide a power amplifier module and a communication device in which power noise is reduced.

DETAILED DESCRIPTION OF THE DISCLOSURE

Hereinafter, embodiments of the present disclosure will be described in detail with reference to embodiments and the drawings. Note that each of the embodiments described below illustrates a comprehensive or specific example. The numerical values, forms, materials, constituent elements, the arrangements and connections of the constituent elements, and so on illustrated in the following embodiments are examples and are not intended to limit the present disclosure. Among the constituent elements illustrated in the following embodiments, constituent elements not described in the independent claims will be described as optional constituent elements. Furthermore, the sizes and size ratios of the constituent elements illustrated in the drawings are not necessary accurate.

First Embodiment

[1.1 Circuit Configuration of PA Module 1 According to First Embodiment]

Figure 1:
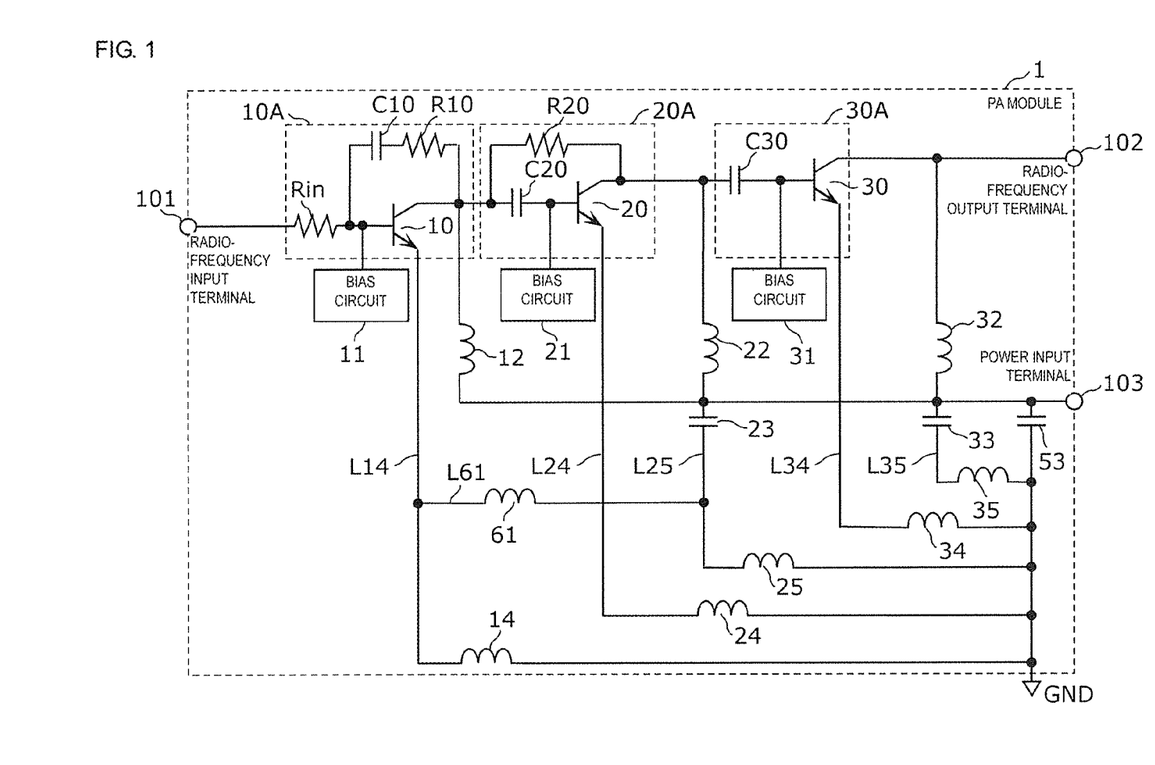
FIG. 1 is an equivalent circuit diagram of a power amplifier module according to a first embodiment.

FIG. 1 is an equivalent circuit diagram of a PA (power amplifier) module 1 according to a first embodiment. The PA module 1 (power amplifier module) illustrated in FIG. 1 includes a radio-frequency input terminal 101, a radio-frequency output terminal 102, a first amplifier circuit 10A, a second amplifier circuit 20A, a third amplifier circuit 30A, bias circuits 11, 21, and 31, choke coils 12, 22, and 32, bypass capacitors 23, 33, and 53, a first wiring line L14, a second wiring line L24, a third wiring line L25, a fourth wiring line L61, a sixth wiring line L34, and a seventh wiring line L35.

The PA module 1 is configured such that the above-described constituent elements are mounted on or in a multilayer substrate. This multilayer substrate has a ground pattern layer (corresponding to GND in FIG. 1) that is connected to the ground terminal of a power source.

The first amplifier circuit 10A has an amplifier transistor 10, an input resistor Rin connected to the base terminal of the amplifier transistor 10, and a capacitor C10 and a resistor R10 connected between the base and the collector of the amplifier transistor 10. The second amplifier circuit 20A has an amplifier transistor 20, a capacitor C20 connected to the base terminal of the amplifier transistor 20, and a resistor R20 connected between the base and the collector of the amplifier transistor 20. The third amplifier circuit 30A has an amplifier transistor 30 and a capacitor C30 connected to the base terminal of the amplifier transistor 30. Note that the above-described circuit configurations of the first amplifier circuit 10A, the second amplifier circuit 20A, and the third amplifier circuit 30A are examples and are not limited to these.

The amplifier transistor 10 is a first power amplifier element disposed on the multilayer substrate and having a first terminal (collector terminal), a second terminal (emitter terminal), and a first input terminal (base terminal). The amplifier transistor 20 is a second power amplifier element disposed on a side of the multilayer substrate closer to the power source (power input terminal 103) than the amplifier transistor 10 and having a third terminal (collector terminal), a fourth terminal (emitter terminal), and a second input terminal (base terminal). The amplifier transistor 30 is a third power amplifier element disposed on a side of the multilayer substrate closer to the power source (power input terminal 103) than the amplifier transistors 10 and 20 and having a fifth terminal (collector terminal), a sixth terminal (emitter terminal), and a third input terminal (base terminal).

The collector terminal (first terminal) of the amplifier transistor 10 is connected to the base terminal (second input terminal) of the amplifier transistor 20, and the collector terminal (third terminal) of the amplifier transistor 20 is connected to the base terminal (third input terminal) of the amplifier transistor 30. Accordingly, the PA module 1 is configured so that the first amplifier circuit 10A, the second amplifier circuit 20A, and the third amplifier circuit 30A are connected in multiple stages. The base terminal (first input terminal) of the amplifier transistor 10 is connected to the radio-frequency input terminal 101 via the input resistor Rin, the collector terminal (first terminal) thereof is connected to the power input terminal 103 via the choke coil 12, and the emitter terminal (second terminal) thereof is grounded (connected to GND) via the first wiring line L14. The collector terminal (third terminal) of the amplifier transistor 20 is connected to the power input terminal 103 via the choke coil 22, and the emitter terminal (fourth terminal) thereof is grounded (connected to GND) via the second wiring line L24. The collector terminal (fifth terminal) of the amplifier transistor 30 is connected to the power input terminal 103 via the choke coil 32, and the emitter terminal (sixth terminal) thereof is grounded (connected to GND) via the sixth wiring line L34.

Although not illustrated in detail, in each of the first amplifier circuit 10A, the second amplifier circuit 20A, and the third amplifier circuit 30A, a plurality of amplifier transistors are connected in parallel.

The amplifier transistors 10, 20, and 30 are power amplifier elements that amplify a radio-frequency transmission signal inputted from the radio-frequency input terminal 101, are made of, for example, Si or GaAs, and are mainly hetero bipolar transistors (HBTs) or field-effect transistors (FETs). In a case where the amplifier transistors 10, 20, and 30 are formed of CMOS (complementary metal oxide semiconductor) made of Si, it is possible to manufacture the PA module 1 at low cost. In a case where the amplifier transistors 10, 20, and 30 are made of GaAs, it is possible to output a radio-frequency transmission signal having a high amplification performance and noise performance.

The bias circuits 11, 21, and 31 are each formed of a DC current supply transistor and other circuit elements and, when supplied with a bias power voltage and a reference voltage, supply a DC bias voltage (current) from the DC current supply transistor to the base terminals of the amplifier transistors 10, 20, and 30.

The bypass capacitor 23 is a first bypass capacitor having one end connected to the collector terminal of the amplifier transistor 20 via the choke coil 22 and the other end connected to the ground pattern layer (corresponding to GND in FIG. 1) via the third wiring line L25.

The bypass capacitor 33 is a second bypass capacitor having one end connected to the collector terminal of the amplifier transistor 30 via the choke coil 32 and the other end connected to the ground pattern layer (corresponding to GND in FIG. 1) via the seventh wiring line L35.

With the connection configuration described above, the bypass capacitors 23 and 33 have a function of suppressing the fluctuations in a DC power voltage that is supplied to the amplifier transistors 10, 20, and 30.

The first wiring line L14 is a first conductive pattern formed between the amplifier transistor 10 and the ground pattern layer (corresponding to GND in FIG. 1) and connecting the emitter terminal of the amplifier transistor 10 to the ground pattern layer. The first wiring line L14 has an inductance component 14, as illustrated in the equivalent circuit in FIG. 1.

The second wiring line L24 is a second conductive pattern formed between the amplifier transistor 20 and the ground pattern layer (corresponding to GND in FIG. 1) and connecting the emitter terminal of the amplifier transistor 20 to the ground pattern layer. The second wiring line L24 has an inductance component 24, as illustrated in the equivalent circuit in FIG. 1.

The sixth wiring line L34 is a sixth conductive pattern formed between the amplifier transistor 30 and the ground pattern layer (corresponding to GND in FIG. 1) and connecting the emitter terminal of the amplifier transistor 30 to the ground pattern layer. The sixth wiring line L34 has an inductance component 34, as illustrated in the equivalent circuit in FIG. 1.

The third wiring line L25 is a third conductive pattern formed between the bypass capacitor 23 and the ground pattern layer (corresponding to GND in FIG. 1) and connecting the other end of the bypass capacitor 23 to the ground pattern layer. The third wiring line L25 has an inductance component 25, as illustrated in the equivalent circuit in FIG. 1.

The seventh wiring line L35 is a seventh conductive pattern formed between the bypass capacitor 33 and the ground pattern layer (corresponding to GND in FIG. 1) and connecting the other end of the bypass capacitor 33 to the ground pattern layer. The seventh wiring line L35 has an inductance component 35, as illustrated in the equivalent circuit in FIG. 1.

The PA module 1 according to this embodiment is characterized by the fourth wiring line L61 included therein. The fourth wiring line L61 is a fourth conductive pattern formed between the amplifier transistor 10 and bypass capacitor 23 and the ground pattern layer (corresponding to GND in FIG. 1) and connecting the first wiring line L14 to the third wiring line L25. The fourth wiring line L61 has a very small inductance component 61, as illustrated in the equivalent circuit in FIG. 1.

When the fourth wiring line L61 is disposed as described above, the first wiring line L14 and the fourth wiring line L61 are connected in parallel between the amplifier transistor 10 and the ground pattern layer (GND), and therefore, an inductance component generated between the emitter terminal of the amplifier transistor 10 and the ground pattern layer (GND) can be made smaller than the inductance component 14 of the first wiring line L14. Therefore, it is possible to reduce power noise in the PA module 1.

[1.2 Circuit Configuration of PA Module 500 According to Comparative Example]

Figure 2:
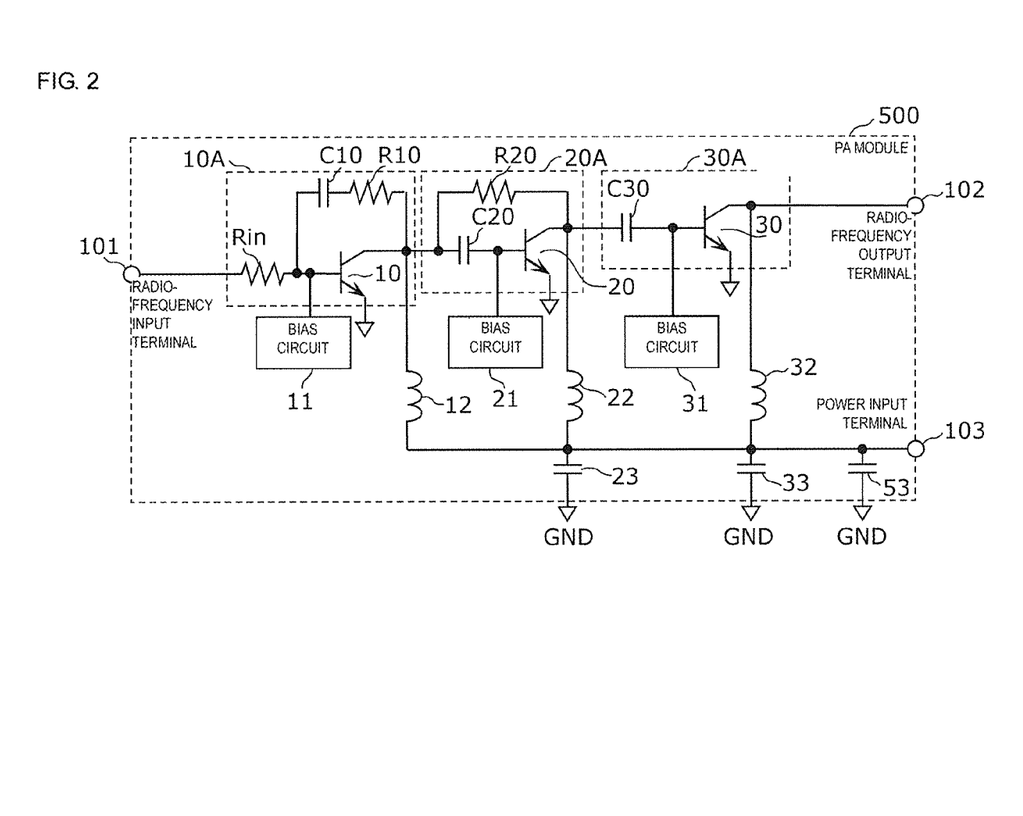
FIG. 2 is a circuit configuration diagram of a power amplifier module according to a comparative example.

FIG. 2 is a circuit configuration diagram of a PA module 500 according to a comparative example. The PA module 500 illustrated in FIG. 2 includes the radio-frequency input terminal 101, the radio-frequency output terminal 102, the first amplifier circuit 10A, the second amplifier circuit 20A, the third amplifier circuit 30A, the bias circuits 11, 21, and 31, the choke coils 12, 22, and 32, and the bypass capacitors 23, 33, and 53. The connection relationships between the above-described constituent elements are the same as the connection relationships in the PA module 1 according to the first embodiment.

Figure 3:
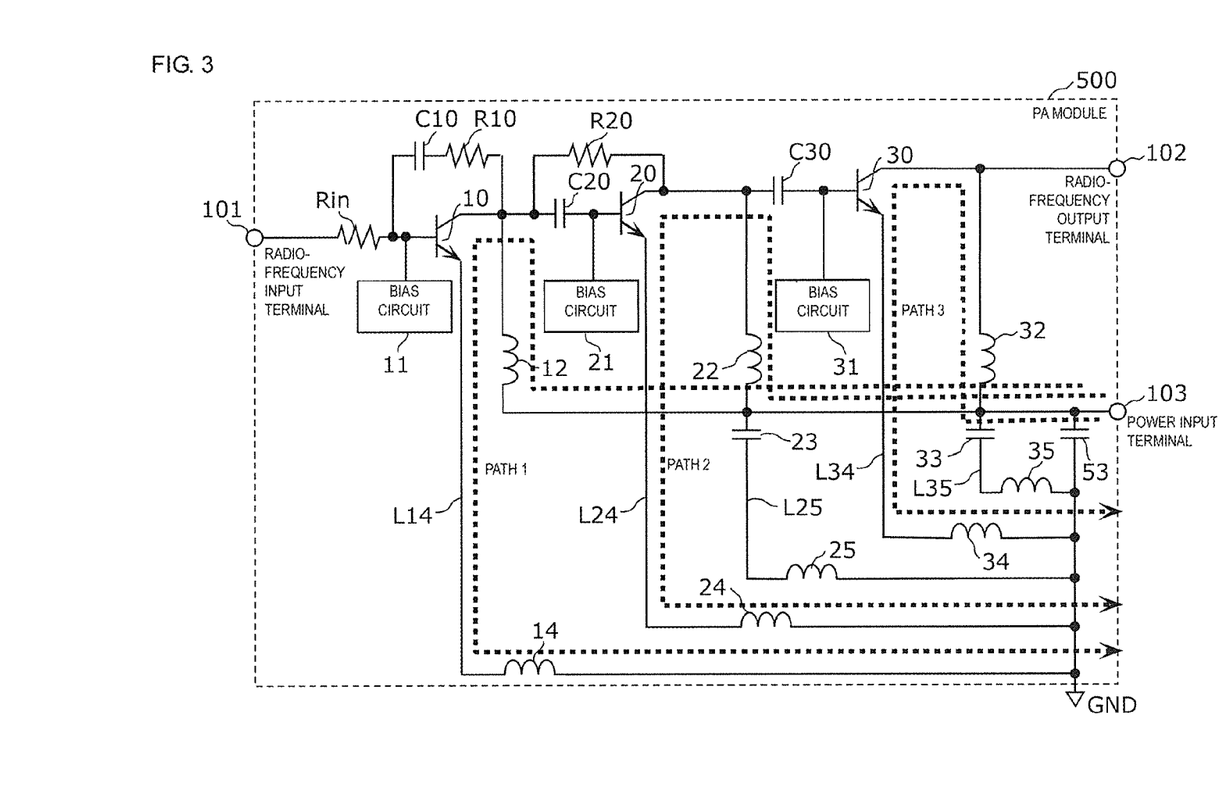
FIG. 3 is an equivalent circuit diagram of the power amplifier module according to the comparative example.

FIG. 3 is an equivalent circuit diagram of the PA module 500 according to the comparative example. In a case where the PA module 500 is mounted on a multilayer substrate in which a power amplifier circuit, a communication band selection switch, a matching circuit component, and other circuit elements are embedded, the amplifier transistors and bypass capacitors disposed on the multilayer substrate are connected to a ground pattern layer (corresponding to GND in FIG. 3) disposed in the multilayer substrate by using conductive wiring lines formed in or on the multilayer substrate, as illustrated in FIG. 3. More specifically, the first wiring line L14 is formed between the amplifier transistor 10 and the ground pattern layer. The second wiring line L24 is formed between the amplifier transistor 20 and the ground pattern layer. The third wiring line L25 is formed between the bypass capacitor 23 and the ground pattern layer. The sixth wiring line L34 is formed between the amplifier transistor 30 and the ground pattern layer. The seventh wiring line L35 is formed between the bypass capacitor 33 and the ground pattern layer. The first wiring line L14 has the inductance component 14, the second wiring line L24 has the inductance component 24, the third wiring line L25 has the inductance component 25, the sixth wiring line L34 has the inductance component 34, and the seventh wiring line L35 has the inductance component 35.

As described above, in the PA module 500 formed on the multilayer substrate, the inductance components 14, 24, 25, 34, and 35 are generated in the grounded parts of the amplifier transistors due to the wiring lines that connect the amplifier transistors and the ground pattern layer (GND) formed in the multilayer substrate to each other, and cause an increase in power noise, which is an issue. For example, in the PA module 500 illustrated in the equivalent circuit in FIG. 3, a return current flowing through path 1 that extends from the power input terminal 103, through the choke coil 12, the amplifier transistor 10, and the first wiring line L14, to the ground pattern layer (GND) and the inductance component 14 cause an increase in power noise (V) expressed by V=L(di/dt). A return current flowing through path 2 that extends from the power input terminal 103, through the choke coil 22, the amplifier transistor 20, the second wiring line L24, to the ground pattern layer (GND) and the inductance component 24 cause an increase in power noise (V) expressed by V=L(di/dt). A return current flowing through path 3 that extends from the power input terminal 103, through the choke coil 32, the amplifier transistor 30, the sixth wiring line L34, to the ground pattern layer (GND) and the inductance component 34 cause an increase in power noise (V) expressed by V=L(di/dt).

[1.3 Power Noise Reduction Effect by PA Module 1]

Unlike the above-described PA module 500 according to the comparative example, in the PA module 1 according to the first embodiment, the first wiring line L14 for grounding the emitter of the amplifier transistor 10 and the third wiring line L25 for grounding the bypass capacitor 23 are connected to each other by the fourth wiring line L61 closer to the amplifier transistor 10 than the ground pattern layer (GND). Accordingly, the first wiring line L14 and the fourth wiring line L61 are connected in parallel between the amplifier transistor 10 and the ground pattern layer (GND), and therefore, the inductance component generated between the emitter terminal of the amplifier transistor 10 and the ground pattern layer (GND) can be made smaller than the inductance component 14 of the first wiring line L14. As a result, it is possible to reduce power noise in the PA module 1.

[1.4 Circuit Configuration of PA Module 2 According to Modification]

Figure 4:
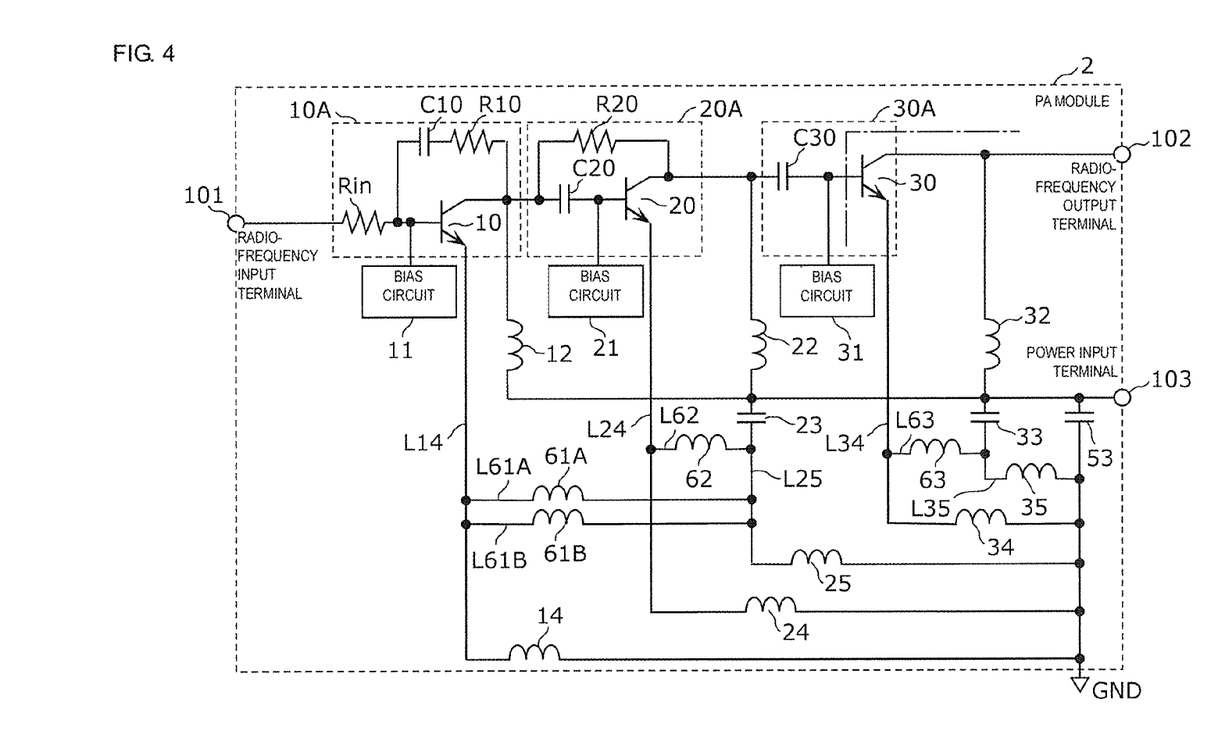
FIG. 4 is an equivalent circuit diagram of a power amplifier module according to a modification of the first embodiment.

FIG. 4 is an equivalent circuit diagram of a PA module 2 according to a modification of the first embodiment. The PA module 2 (power amplifier module) illustrated in FIG. 4 includes the radio-frequency input terminal 101, the radio-frequency output terminal 102, the first amplifier circuit 10A, the second amplifier circuit 20A, the third amplifier circuit 30A, the bias circuits 11, 21, and 31, the choke coils 12, 22, and 32, the bypass capacitors 23, 33, and 53, the first wiring line L14, the second wiring line L24, the third wiring line L25, fourth wiring lines L61A and L61B, a fifth wiring line L62, the sixth wiring line L34, the seventh wiring line L35, and an eighth wiring line L63.

The configuration of the PA module 2 according to this modification is different from that of the PA module 1 according to the first embodiment in that (1) the two fourth wiring lines are disposed and (2) the fifth wiring line L62 and the eighth wiring line L63 are disposed. Hereinafter, a description of the PA module 2 according to this modification will be given while focusing mainly on the differences from the PA module 1 according to the first embodiment, and a description of the matters the same as those in the PA module 1 according to the first embodiment will be omitted.

The fourth wiring lines L61A and L61B constitute the fourth conductive pattern formed between the amplifier transistor 10 and bypass capacitor 23 and the ground pattern layer (GND) and connecting the first wiring line L14 and the third wiring line L25 to each other. The fourth wiring lines L61A and L61B respectively have very small inductance components 61A and 61B, as illustrated in the equivalent circuit in FIG. 4. The fourth wiring lines L61A and L61B are formed in the same layer of the multilayer substrate and are connected in parallel between the first wiring line L14 and the third wiring line L25.

Accordingly, the combined inductance component of the fourth wiring lines L61A and L61B can be made smaller than that in the case where the fourth conductive pattern is constituted by one conductive wiring line. That is, when the fourth wiring lines L61A and L61B each having a smaller inductance component are connected in parallel to the first wiring line L14, the inductance component generated between the emitter terminal of the amplifier transistor 10 and the ground pattern layer (GND) can be further reduced.

The fifth wiring line L62 is a fifth conductive pattern formed between the amplifier transistor 20 and bypass capacitor 23 and the ground pattern layer (GND) and connecting the second wiring line L24 and the third wiring line L25 to each other. The fifth wiring line L62 has a very small inductance component 62, as illustrated in the equivalent circuit in FIG. 4.

Accordingly, the second wiring line L24 for grounding the emitter of the amplifier transistor 20 and the third wiring line L25 for grounding the bypass capacitor 23 are connected to each other by the fifth wiring line L62 closer to the amplifier transistor 20 than the ground pattern layer (GND). Therefore, the second wiring line L24 and the fifth wiring line L62 are connected in parallel between the amplifier transistor 20 and the ground pattern layer (GND). Accordingly, an inductance component generated between the emitter terminal of the amplifier transistor 20 and the ground pattern layer (GND) can be made smaller than the inductance component 24 of the second wiring line L24. As a result, it is possible to reduce power noise mainly in the amplifier transistor 20 and to reduce power noise in the PA module 2 accordingly.

The eighth wiring line L63 is an eighth conductive pattern formed between the amplifier transistor 30 and bypass capacitor 33 and the ground pattern layer (GND) and connecting the sixth wiring line L34 to the seventh wiring line L35. The eighth wiring line L63 has a very small inductance component 63, as illustrated in the equivalent circuit in FIG. 4.

Accordingly, the sixth wiring line L34 for grounding the emitter of the amplifier transistor 30 and the seventh wiring line L35 for grounding the bypass capacitor 33 are connected to each other by the eighth wiring line L63 closer to the amplifier transistor 30 than the ground pattern layer (GND). Therefore, the sixth wiring line L34 and the eighth wiring line L63 are connected in parallel between the amplifier transistor 30 and the ground pattern layer (GND). Accordingly, an inductance component generated between the emitter terminal of the amplifier transistor 30 and the ground pattern layer (GND) can be made smaller than the inductance component 34 of the sixth wiring line L34. As a result, it is possible to reduce power noise mainly in the amplifier transistor 30 and to reduce power noise in the PA module 2 accordingly.

In the PA module 2 according to this modification, the two fourth wiring lines, namely, the fourth wiring lines L61A and L61B, and the one fifth wiring line, namely, the fifth wiring line L62, are disposed. That is, the number of conductive wiring lines constituting the fourth conductive pattern is larger than the number of conductive wiring lines constituting the fifth conductive pattern.

The distance between the amplifier transistor 10 and the ground pattern layer (GND) connected to the ground terminal of the power source is longer the distance between the amplifier transistor 20 and the ground pattern layer (GND), and therefore, the first wiring line L14 is longer than the second wiring line L24, and the inductance component 14 is larger than the inductance component 24. Meanwhile, the number of conductive wiring lines constituting the fourth conductive pattern is larger than the number of conductive wiring lines constituting the fifth conductive pattern, and therefore, the inductance component of the fourth conductive pattern is smaller than the inductance component of the fifth conductive pattern. Accordingly, the inductance component generated between the emitter terminal of the amplifier transistor 10 and the ground pattern layer (GND) can be further made smaller than the inductance component generated between the emitter terminal of the amplifier transistor 20 and the ground pattern layer (GND). As a result, it is possible to effectively reduce power noise in the PA module 2.

Note that a case is possible where the number of conductive wiring lines constituting the fourth conductive pattern is equal to the number of conductive wiring lines constituting the fifth conductive pattern and where the line width of a conductive wiring line constituting the fourth conductive pattern is larger than the line width of a conductive wiring line constituting the fifth conductive pattern. Furthermore, a case is possible where the number and line width of conductive wiring lines constituting the fourth conductive pattern are equal to the number and line width of conductive wiring lines constituting the fifth conductive pattern and where a conductive wiring line constituting the fourth conductive pattern is shorter than a conductive wiring line constituting the fifth conductive pattern. Also, in these cases, the inductance component of the fourth conductive pattern is smaller than that of the fifth conductive pattern. As a result, it is possible to effectively reduce power noise in the PA module 2.

[1.5 Mounting Configuration of PA Module 2 According to Modification]

Figure 5:
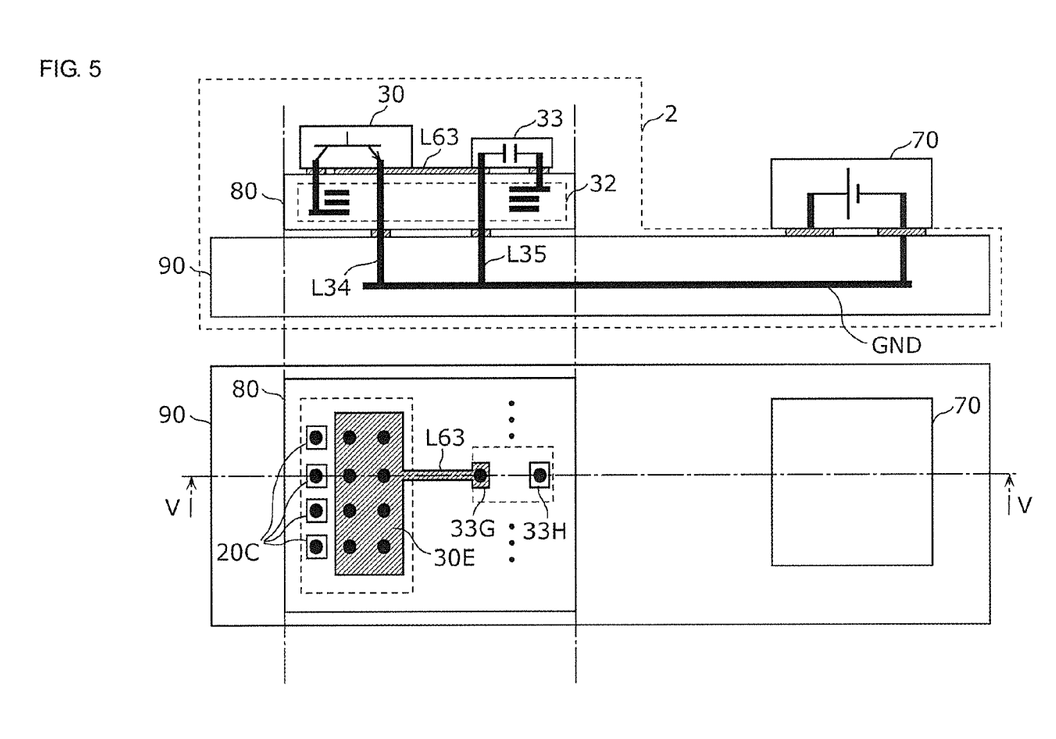
FIG. 5 is a diagram illustrating a mounting configuration of the power amplifier module according to the modification of the first embodiment.

FIG. 5 is a diagram illustrating a mounting configuration of the PA module 2 according to the modification of the first embodiment. A plan view of the PA module 2 according to this modification and a power source 70 is found in the lower portion of FIG. 5, and a cross-sectional view taken along V-V of the plan view is found in the upper portion thereof. As illustrated in FIG. 5, the PA module 2 has a multilayer mount board 90, a multilayer circuit board 80, the amplifier transistor 30, and the bypass capacitor 33. Note that FIG. 5 illustrates only the third amplifier circuit 30A and its peripheral circuit elements in the PA module 2.

The multilayer mount board 90 and the multilayer circuit board 80 are, for example, resin multilayer substrates formed by, for example, stacking low temperature co-fired ceramic substrates (LTCC substrates) or glass epoxy substrates. The amplifier transistor 30, the bypass capacitor 33, the other circuit elements, and so on may be coated with, for example, epoxy resin, on the multilayer mount board 90.

Note that, in the plan view in the lower portion of FIG. 5, the electrode layout on the surface of the multilayer circuit board 80 on which the amplifier transistor 30 and the bypass capacitor 33 are seen through is illustrated.

On the multilayer mount board 90, the multilayer circuit board 80 and the power source 70 are disposed. On the multilayer circuit board 80, the amplifier transistor 30 and the bypass capacitor 33 are disposed. In the multilayer circuit board 80, the choke coil 32 is formed. In the multilayer circuit board 80 and the multilayer mount board 90, the sixth wiring line L34 connecting the emitter terminal of the amplifier transistor 30 to the ground pattern layer (GND) and the seventh wiring line L35 connecting the other terminal of the bypass capacitor 33 to the ground pattern layer (GND) are formed by via wiring. On the surface of the multilayer circuit board 80, a ground pattern 30E of the amplifier transistor 30, electrodes 20C connected to the collector terminal of the amplifier transistor 30, an electrode 33H connected to the one end of the bypass capacitor 33, and an electrode 33G connected to the other end thereof are formed. On the surface of the multilayer circuit board 80, the eighth wiring line L63 is also formed in addition to the above-described electrodes. That is, the eighth wiring line L63 is formed between the amplifier transistor 30 and bypass capacitor 33 and the ground pattern layer (GND) and connects the sixth wiring line L34 to the seventh wiring line L35. The eighth wiring line L63 need not be formed on the surface of the multilayer circuit board 80 and may be formed in the multilayer circuit board 80 or above the ground pattern layer (GND) of the multilayer mount board 90.

With the above-described configuration, the sixth wiring line L34 for grounding the emitter of the amplifier transistor 30 and the seventh wiring line L35 for grounding the bypass capacitor 33 are connected to each other by the eighth wiring line L63 closer to the amplifier transistor 30 than the ground pattern layer (GND). Therefore, the sixth wiring line L34 and the eighth wiring line L63 (and the seventh wiring line L35 connected in series) are connected in parallel between the amplifier transistor 30 and the ground pattern layer (GND). Accordingly, the inductance component generated between the emitter terminal of the amplifier transistor 30 and the ground pattern layer (GND) can be made smaller than the inductance component 34 of the sixth wiring line L34. As a result, it is possible to reduce power noise in the PA module 2.

Note that, in the PA module 2 according to this modification, the eighth wiring line L63, and the fifth wiring line L62 connecting the second wiring line L24 to the third wiring line L25 may be formed in different layers of the multilayer circuit board 80. Accordingly, the fifth wiring line L62 and the eighth wiring line L63 can be disposed and laid out more flexibly, and therefore, the impedances of the amplifier transistors 20 and 30 can be adjusted more easily.

[1.6 Mounting Configuration of PA Module 1 According to First Embodiment]

Figure 6:
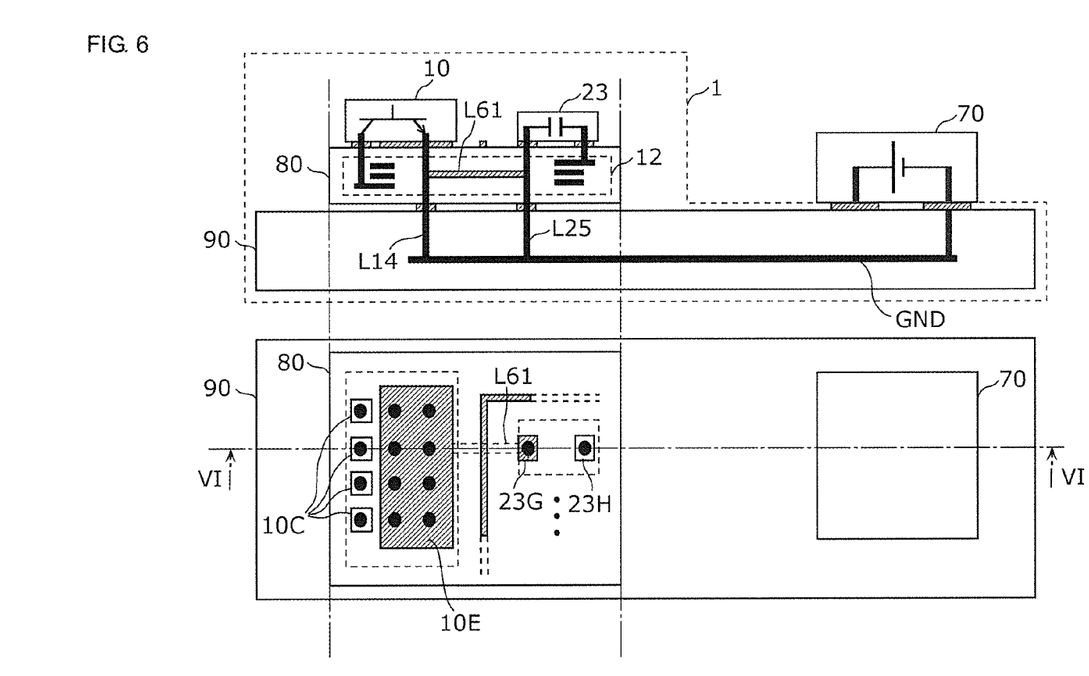
FIG. 6 is a diagram illustrating a mounting configuration of the power amplifier module according to the first embodiment.

FIG. 6 is a diagram illustrating a mounting configuration of the PA module 1 according to the first embodiment. A plan view of the PA module 1 according to the first embodiment and the power source 70 is found in the lower portion of FIG. 6, and a cross-sectional view taken along VI-VI of the plan view is found in the upper portion thereof. As illustrated in FIG. 6, the PA module 1 has the multilayer mount board 90, the multilayer circuit board 80, the amplifier transistor 10, and the bypass capacitor 23. Note that FIG. 6 illustrates only the first amplifier circuit 10A and its peripheral circuit elements in the PA module 1.

Note that, in the plan view in the lower portion of FIG. 6, the electrode layout on the surface of the multilayer circuit board 80 on which the amplifier transistor 10 and the bypass capacitor 23 are seen through is illustrated.

On the multilayer mount board 90, the multilayer circuit board 80 and the power source 70 are disposed. On the multilayer circuit board 80, the amplifier transistor 10 and the bypass capacitor 23 are disposed. In the multilayer circuit board 80, the choke coil 12 is formed. In the multilayer circuit board 80 and the multilayer mount board 90, the first wiring line L14 connecting the emitter terminal of the amplifier transistor 10 to the ground pattern layer (GND) and the third wiring line L25 connecting the other terminal of the bypass capacitor 23 to the ground pattern layer (GND) are formed by via wiring. On the surface of the multilayer circuit board 80, a ground pattern 10E of the amplifier transistor 10, electrodes 10C connected to the collector terminal of the amplifier transistor 10, an electrode 23H connected to the one end of the bypass capacitor 23, and an electrode 23G connected to the other end thereof are formed. In an internal layer of the multilayer circuit board 80, the fourth wiring line L61 is formed. That is, the fourth wiring line L61 is formed between the amplifier transistor 10 and bypass capacitor 23 and the ground pattern layer (GND) and connects the first wiring line L14 to the third wiring line L25.

In a case where, for example, a circuit element or a wiring line is disposed on the surface of the multilayer circuit board 80 in a region between the first wiring line L14 and the third wiring line L25, it may be difficult to form the fourth wiring line L61 in the region. In this case, the fourth wiring line L61 may be formed in an internal layer of the multilayer circuit board 80 as described above. Note that the fourth wiring line L61 need not be formed on the surface of or in the multilayer circuit board 80 and may be formed above the ground pattern layer (GND) of the multilayer mount board 90.

With the above-described configuration, the first wiring line L14 for grounding the emitter of the amplifier transistor 10 and the third wiring line L25 for grounding the bypass capacitor 23 are connected to each other by the fourth wiring line L61 closer to the amplifier transistor 10 than the ground pattern layer (GND). Therefore, the first wiring line L14 and the fourth wiring line L61 (and the third wiring line L25 connected in series) are connected in parallel between the amplifier transistor 10 and the ground pattern layer (GND). Accordingly, the inductance component generated between the emitter terminal of the amplifier transistor 10 and the ground pattern layer (GND) can be made smaller than the inductance component 14 of the first wiring line L14. As a result, it is possible to reduce power noise in the PA module 1.

In this embodiment and the modification thereof, the PA module 1 having the fourth wiring line L61 and the PA module 2 having the fourth wiring lines L61A and L61B, the fifth wiring line L62, and the eighth wiring line L63 have been illustrated; however, PA modules according to the present disclosure are not limited to these. Examples of the PA modules according to the present disclosure include a PA module having the fourth wiring line L61, the fifth wiring line L62, and the eighth wiring line L63, a PA module having the fourth wiring line L61 and the fifth wiring line L62, a PA module having the fourth wiring line L61 and the eighth wiring line L63, and a PA module having only the fourth wiring lines L61A and L61B.

Second Embodiment

The PA module 1 or 2 according to the first embodiment or the modification thereof is applicable to a PA module of an envelope tracking system. In a second embodiment, a PA module of an envelope tracking system will be described.

Figure 7:
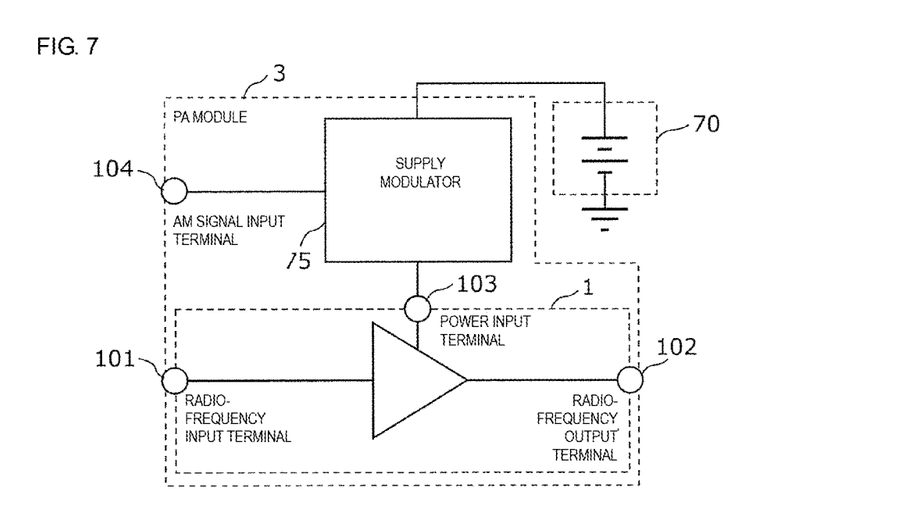
FIG. 7 is a circuit configuration diagram of a power amplifier module according to a second embodiment.

FIG. 7 is a circuit configuration diagram of a PA module 3 according to the second embodiment. The PA module 3 illustrated in FIG. 7 includes the PA module 1 and a supply modulator 75 and operates in accordance with an envelope tracking system (hereinafter referred to as "ET system").

The PA module 1 is the PA module according to the first embodiment and is configured so as to be capable of reducing power noise.

The supply modulator 75 modulates a DC voltage supplied from the power source 70 in accordance with amplitude information (envelope) about output power inputted from an AM signal input terminal 104 and applies the modulated voltage to the collector terminal of each of the amplifier transistors 10, 20, and 30 via the power input terminal 103. Note that the supply modulator 75 may include the power source 70. That is, the supply modulator 75 functions as an envelope amplifier.

With the above-described configuration, the collector voltage of the amplifier transistors 10, 20, and 30 is changed in accordance with the output power to thereby reduce power loss that occurs in an operation in a case where the power voltage is a fixed voltage, and it is possible to effectively reduce power noise. Furthermore, the power voltage is changed in accordance with the amplitude information to thereby make the amplifier transistors 10, 20, and 30 operate in a substantially saturated state, and it is possible to increase the efficiency of the PA module 3. In a case of, for example, a WCDMA (wideband code division multiple access) modulating signal for which the ratio between the average output power and the peak output power of a power amplifier is large, when the amplifier transistors are operated at a fixed voltage, efficiency decreases for the average output power. However, in the PA module 3 that employs an ET system, the collector voltage is changed in accordance with the output power to thereby achieve increased efficiency.

In a case where the PA module 3 is applied to a multimode multiband system, the supply modulator 75 can change the modulation factor for the power voltage for each mode and each band. Therefore, the PA module 3 is favorable to a multimode multiband system.

Third Embodiment

In a third embodiment, a frontend circuit and a communication device that include the PA module 1 or 2 according to the first embodiment or the PA module 3 according to the second embodiment will be described.

Figure 8:
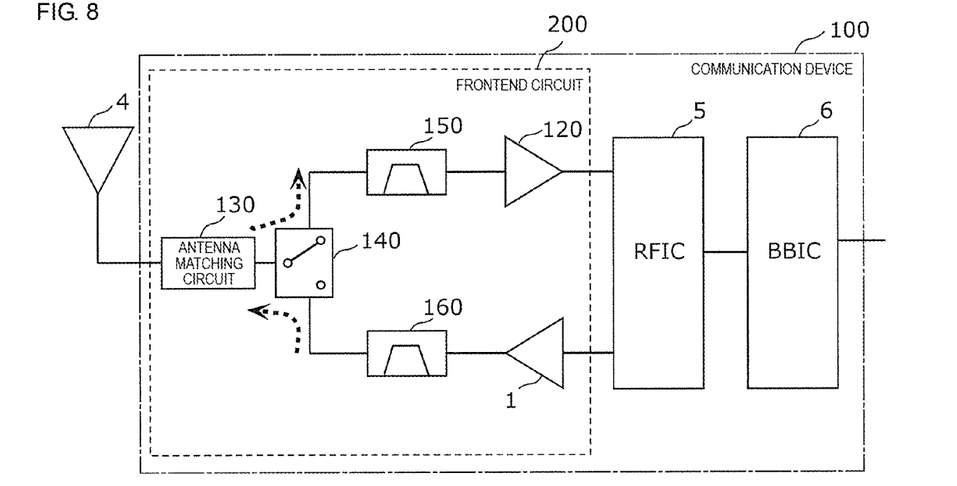
FIG. 8 is a circuit configuration diagram of a communication device according to a third embodiment.

FIG. 8 is a circuit configuration diagram of a communication device 100 according to the third embodiment. FIG. 8 illustrates the communication device 100 and an antenna element 4. The communication device 100 includes a frontend circuit 200, an RF signal processing circuit 5, and a baseband signal processing circuit 6. The frontend circuit 200 is disposed in a frontend part of, for example, a multimode/multiband-ready mobile phone.

The frontend circuit 200 includes the PA module 1, a low-noise amplifier circuit 120, an antenna matching circuit 130, an antenna switch 140, a reception filter 150, and a transmission filter 160.

The antenna matching circuit 130 is connected to the antenna element 4 and to the antenna switch 140, and matches the antenna element 4 with the frontend circuit 200. Accordingly, the frontend circuit 200 can receive a reception signal from the antenna element 4 with low loss and outputs a transmission signal to the antenna element 4 with low loss. The antenna matching circuit 130 is constituted by one or more radio-frequency circuit components, and is formed of an inductor in the form of a chip or a pattern, or a capacitor in the form of a chip or a pattern. Note that the antenna matching circuit 130 is not an essential constituent element of the frontend circuit 200. Furthermore, the antenna matching circuit 130 may be a multiband multimode-ready variable matching circuit that changes the impedance in accordance with a selected band or mode.

The antenna switch 140 is a separator that connects the antenna element 4 (and the antenna matching circuit 130) with either a transmission-side signal path or a reception-side signal path to switch connections between the antenna element 4 and the plurality of signal paths. More specifically, the antenna switch 140 includes a common terminal connected to the antenna matching circuit 130 and two selection terminals for connecting with the transmission-side signal path or the reception-side signal path described above.

Note that, in FIG. 8, the antenna switch 140 is a radio-frequency switch of a single-pole double-throw type; however, in a case where a plurality of transmission-side signal paths and a plurality of reception-side signal paths are disposed, the antenna switch 140 is not limited to a switch of a single-input double-output type. Furthermore, a multiplexer including a duplexer or a triplexer for separating a transmission wave and a reception wave from each other may be disposed instead of the antenna switch 140.

The reception filter 150 is a reception filter element that filters a reception signal received by the antenna element 4 and passing through the antenna switch 140 with a predetermined passband and outputs the filtered signal to the low-noise amplifier circuit 120.

The transmission filter 160 is a transmission filter element that filters a transmission signal outputted from the PA module 1 with a predetermined passband and outputs the filtered signal to the antenna element 4 via the antenna switch 140.

The PA module 1 is a power amplifier module that amplifies a radio-frequency transmission signal outputted from the RF signal processing circuit 5 and outputs the amplified signal toward the antenna switch 140. The PA module 1 is the PA module 1 according to the first embodiment. Note that the PA module according to this embodiment may be the PA module 2 according to the modification of the first embodiment or the PA module 3 according to the second embodiment instead of the PA module 1 according to the first embodiment.

The low-noise amplifier circuit 120 is a radio-frequency amplifier circuit that amplifies a radio-frequency reception signal outputted from the antenna switch 140 and outputs the amplified signal to the RF signal processing circuit 5.

The RF signal processing circuit 5 performs signal processing, such as down conversion, on a radio-frequency reception signal inputted from the antenna element 4 via the reception-side signal path and outputs a reception signal generated as a result of the signal processing to the baseband signal processing circuit 6. The RF signal processing circuit 5 is, for example, an RFIC (radio frequency integrated circuit). Furthermore, the RF signal processing circuit 5 performs signal processing, such as up conversion, on a transmission signal inputted from the baseband signal processing circuit 6 and outputs a radio-frequency transmission signal generated as a result of the signal processing to the PA module 1.

The baseband signal processing circuit 6 is a circuit that performs signal processing using an intermediate frequency band lower than the frequency band of a radio-frequency signal in the frontend part. A signal processed by the baseband signal processing circuit 6 is used in, for example, image display or telephone conversation via a speaker.

Note that the frontend circuit 200 may be configured so as not to include at least one of the reception filter 150 and the transmission filter 160 depending on a required specification.

The frontend circuit 200 illustrated in FIG. 8 has one transmission-side signal path and one reception-side signal path; however, the frontend circuit 200 may have a plurality of transmission-side signal paths and a plurality of reception-side signal paths so as to be ready for multiband. In this case, the PA module 1, the low-noise amplifier circuit 120, the reception filter 150, and the transmission filter 160 may be disposed for each of the signal paths corresponding to the respective frequency bands. Furthermore, the PA module 1, the low-noise amplifier circuit 120, the reception filter 150, and the transmission filter 160 may be configured so as to be capable of changing the bandpass characteristics and the amplification characteristics in accordance with a selected frequency band. In this case, the number of PA modules 1, the number of low-noise amplifier circuits 120, the number of reception filters 150, and the number of transmission filters 160 may be smaller than the number of signal paths.

With the above-described configuration, it is possible to provide the frontend circuit 200 and the communication device 100 in which power noise is reduced.

OTHER EMBODIMENTS AND SO ON

The power amplifier module, the frontend circuit, and the communication device according to the embodiments of the present disclosure have been described with reference to the first to third embodiments; however, the power amplifier module, the frontend circuit, and the communication device according to the present disclosure are not limited to those in the above-described embodiments. Another embodiment obtained by combining any of the constituent elements in the above-described embodiments, a modification obtained by making various modifications conceived by a person skilled in the art to the above-described embodiments without departing from the spirit of the present disclosure, and various devices that include the power amplifier module, the frontend circuit, and the communication device of the present disclosure are also included in the present disclosure.

Note that the first wiring line L14, the second wiring line L24, the third wiring line L25, the fourth wiring line L61, the fifth wiring line L62, the sixth wiring line L34, the seventh wiring line L35, and the eighth wiring line L63 are not limited to linear wiring lines and need to be conductive patterns that are formed in a predetermined conductive layer that constitutes the multilayer substrate.

Furthermore, in the power amplifier module, the frontend circuit, and the communication device according to the above-described embodiments, other radio-frequency circuit elements, other wiring lines, and so on may be inserted into paths that connect circuit elements and signal paths disclosed by the drawings.

Furthermore, in the first embodiment, the three-stage PA module in which the amplifier transistors 10, 20, and 30 are cascade-connected has been described; however, the PA modules according to the present disclosure are not limited by the number of stages of the amplifier transistors.

The present disclosure is widely applicable to communication devices, such as mobile phones, as a power amplifier module that is disposed in a multiband/multimode-ready frontend part.

1, 2, 3, 500 PA module
4 antenna element
5 RF signal processing circuit
6 baseband signal processing circuit
10A first amplifier circuit
10C, 20C, 23G, 23H, 33G, 33H electrode
10E, 30E ground pattern
11, 21, 31, 604, 605 bias circuit
12, 22, 32 choke coil
14, 24, 25, 34, 35, 61, 61A, 61B, 62, 63 inductance component
20A second amplifier circuit
23, 33, 53 bypass capacitor 30A third amplifier circuit
70 power source
75 supply modulator
80 multilayer circuit board
90 multilayer mount board
100 communication device
101 radio-frequency input terminal
102 radio-frequency output terminal
103 power input terminal
104 AM signal input terminal
120 low-noise amplifier circuit
130 antenna matching circuit
140 antenna switch
150 reception filter
160 transmission filter
200 frontend circuit
601 subsequent radio-frequency transistor
602 succeeding radio-frequency transistor
603 matching circuit
606, 607 bias power terminal
641, 651 strip line
642, 652 radio-frequency bypass capacitor
643, 653 bias resistor
644, 654 bias bleeder resistor
C10, C20, C30 capacitor
L14 first wiring line
L24 second wiring line
L25 third wiring line
L34 sixth wiring line
L35 seventh wiring line
L61, L61A, L61B fourth wiring line
L62 fifth wiring line
L63 eighth wiring line
R10, R20 resistor

The invention claimed is:

1. A power amplifier module, comprising:
a substrate having a ground pattern layer;
a first power amplifier element disposed on the substrate and having a collector, an emitter, and a first input terminal;
a second power amplifier element disposed on the substrate and having a collector, an emitter, and a second input terminal connected to the collector of the first power amplifier element;
a first bypass capacitor connected to the collector of the second power amplifier element;
a first conductive pattern provided between the first power amplifier element and the ground pattern layer and connecting the emitter of the first power amplifier element to the ground pattern layer;
a second conductive pattern provided between the first bypass capacitor and the ground pattern layer and connecting the first bypass capacitor to the ground pattern layer; and
a third conductive pattern provided between the emitter of the first power amplifier element and the ground pattern layer, and between the first bypass capacitor and the ground pattern layer, and connecting the first conductive pattern to the second conductive pattern.

2. The power amplifier module according to claim 1, wherein the third conductive pattern is constituted by a plurality of conductive wiring lines provided in a same layer between the first power amplifier element and the ground pattern layer and between the first bypass capacitor and the ground pattern layer.

3. The power amplifier module according to claim 1, further comprising a fourth conductive pattern provided between the second power amplifier element and the ground pattern layer, and between the first bypass capacitor and the ground pattern layer, and connecting the second conductive pattern to the third conductive pattern.

4. The power amplifier module according to claim 3, further comprising:
a third power amplifier element disposed on a side of the substrate closer to a power source than the first power amplifier element and the second power amplifier element, and having a collector, an emitter, and a third input terminal connected to the collector of the second power amplifier element;
a second bypass capacitor connected to the collector of the third power amplifier element;
a fifth conductive pattern provided between the third power amplifier element and the ground pattern layer, and connecting the emitter of the third power amplifier element to the ground pattern layer;
a sixth conductive pattern provided between the second bypass capacitor and the ground pattern layer, and connecting the second bypass capacitor to the ground pattern layer; and
a seventh conductive pattern provided between the third power amplifier element and the ground pattern layer, and between the second bypass capacitor and the ground pattern layer, and connecting the sixth conductive pattern to the seventh conductive pattern.

5. The power amplifier module according to claim 4, wherein the fourth conductive pattern and the seventh conductive pattern are provided in different layers.

6. The power amplifier module according to claim 3, wherein:
the second power amplifier element is disposed closer to a power source than the first power amplifier element,
the third conductive pattern and the fourth conductive pattern are each constituted by one or more conductive wiring lines, and
a number of conductive wiring lines constituting the third conductive pattern is larger than a number of conductive wiring lines constituting the fourth conductive pattern.

7. The power amplifier module according to claim 3, wherein:
the second power amplifier element is disposed closer to a power source than the first power amplifier element,
the third conductive pattern and the fourth conductive pattern are each constituted by one or more conductive wiring lines, and
a line width of the conductive wiring line constituting the third conductive pattern is larger than a line width of the conductive wiring line constituting the fourth conductive pattern.

8. The power amplifier module according to claim 3, wherein:
the second power amplifier element is disposed closer to a power source than the first power amplifier element,
the third conductive pattern and the fourth conductive pattern are each constituted by a conductive wiring line, and
the conductive wiring line constituting the third conductive pattern is shorter than the conductive wiring line constituting the fourth conductive pattern.

9. The power amplifier module according to claim 1, further comprising a supply modulator modulating a power voltage outputted from a power source in accordance with an envelope tracking system and outputting the modulated power voltage to the collector of the first power amplifier element and to the collector of the second power amplifier element.

10. A frontend circuit comprising:
the power amplifier module according to claim 1;
a transmission filter element and a reception filter element; and
a separator outputting a radio-frequency reception signal from an antenna element to the reception filter element and outputting a radio-frequency transmission signal amplified by the power amplifier module and passing through the transmission filter element to the antenna element.

11. A communication device comprising:
the frontend circuit according to claim 10; and
an RF signal processing circuit outputting a radio-frequency transmission signal to the frontend circuit and receiving a radio-frequency reception signal from the frontend circuit.

12. The power amplifier module according to claim 1, further comprising:
a first wiring inductor disposed on the first conductor pattern between the emitter of the first power amplifier element and the ground pattern layer; and
a second wiring inductor disposed on the second conductor pattern between the bypass capacitor and the ground pattern layer,
wherein the third conductor pattern connects the emitter of the first power amplifier element and the first wiring inductor, and connects the bypass capacitor and the second wiring inductor on the first conductor pattern.

13. The power amplifier module according to claim 1, wherein the third conductor pattern is arranged between the ground pattern layer and the first power amplifier element in a thickness direction of the substrate.

14. The power amplifier module according to claim 13, wherein the conductor pattern or the ground pattern layer comprises a via.

* * * * *